(12) United States Patent
Chuang et al.

(10) Patent No.: US 11,978,740 B2
(45) Date of Patent: May 7, 2024

(54) SEMICONDUCTOR-ON-INSULATOR (SOI) SEMICONDUCTOR STRUCTURES INCLUDING A HIGH-K DIELECTRIC LAYER AND METHODS OF MANUFACTURING THE SAME

(71) Applicant: Taiwan Semiconductor Manufacturing Company Limited, Hsinchu (TW)

(72) Inventors: Harry-Hak-Lay Chuang, Zhubei (TW); Kuo-Ching Huang, Hsinchu (TW); Wei-Cheng Wu, Zhubei (TW); Hsin Fu Lin, Hsinchu (TW); Henry Wang, Hsinchu (TW); Chien Hung Liu, Hsinchu (TW); Tsung-Hao Yeh, Hsinchu (TW); Hsien Jung Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 137 days.

(21) Appl. No.: 17/674,348

(22) Filed: Feb. 17, 2022

(65) Prior Publication Data
US 2023/0261004 A1    Aug. 17, 2023

(51) Int. Cl.
*H01L 27/12*    (2006.01)
*H01L 21/762*    (2006.01)
*H01L 21/84*    (2006.01)
*H01L 29/66*    (2006.01)

(52) U.S. Cl.
CPC .... *H01L 27/1203* (2013.01); *H01L 21/76251* (2013.01); *H01L 21/76283* (2013.01); *H01L 21/84* (2013.01); *H01L 29/66772* (2013.01)

(58) Field of Classification Search
CPC .......... H01L 27/1203; H01L 21/76251; H01L 29/66772; H01L 21/84; H01L 21/76283; H01L 29/78654
USPC ......................................... 257/347; 438/149
See application file for complete search history.

(56) References Cited

U.S. PATENT DOCUMENTS

2023/0018629 A1*    1/2023  Liu ..................... H01L 27/1203

* cited by examiner

*Primary Examiner* — Thinh T Nguyen
(74) *Attorney, Agent, or Firm* — The Marbury Law Group, PLLC

(57) ABSTRACT

A layer stack including a first bonding dielectric material layer, a dielectric metal oxide layer, and a second bonding dielectric material layer is formed over a top surface of a substrate including a substrate semiconductor layer. A conductive material layer is formed by depositing a conductive material over the second bonding dielectric material layer. The substrate semiconductor layer is thinned by removing portions of the substrate semiconductor layer that are distal from the layer stack, whereby a remaining portion of the substrate semiconductor layer includes a top semiconductor layer. A semiconductor device may be formed on the top semiconductor layer.

20 Claims, 8 Drawing Sheets

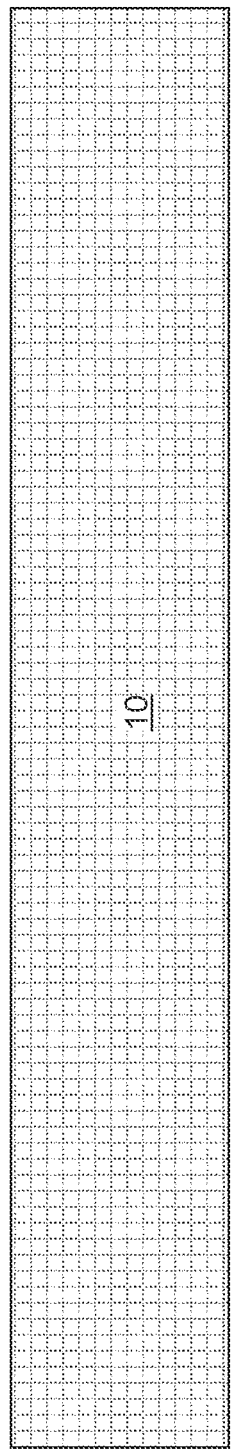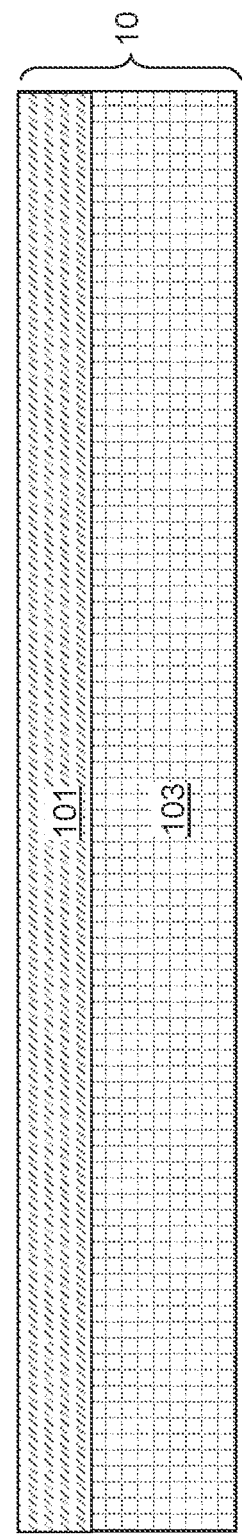

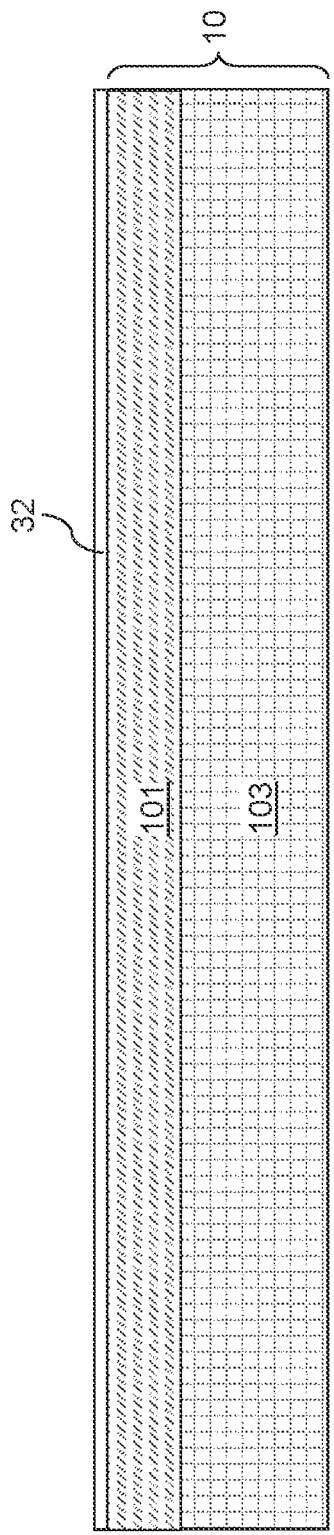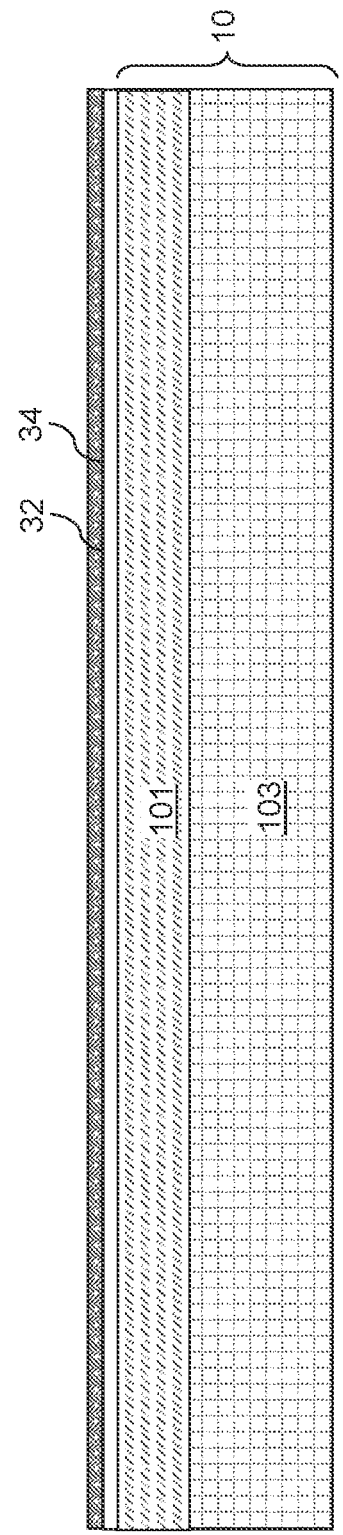

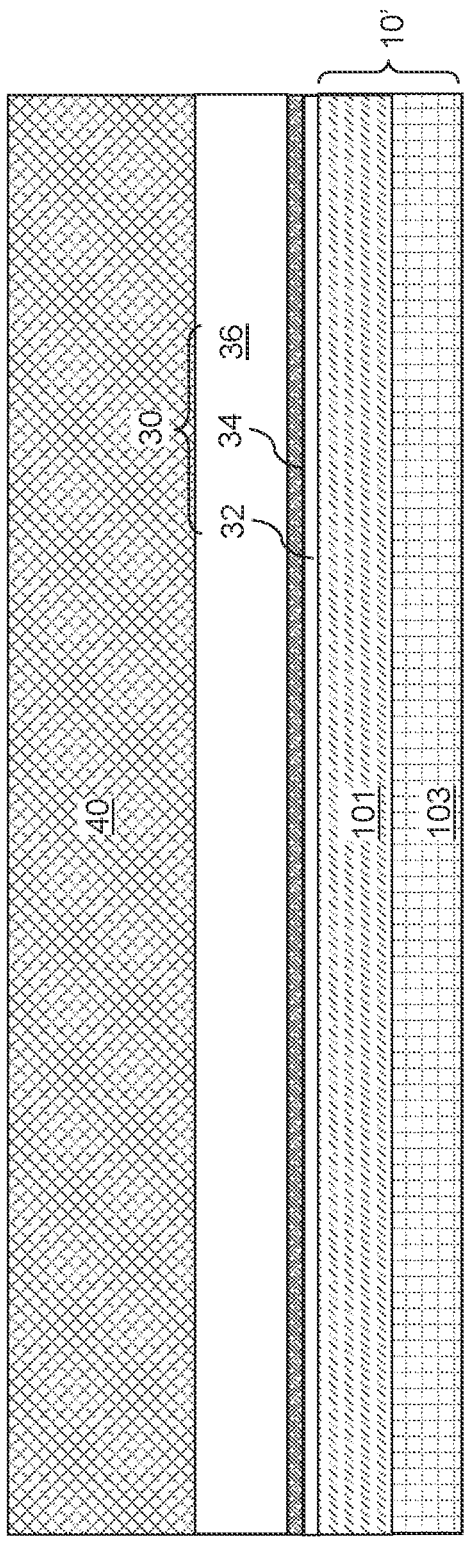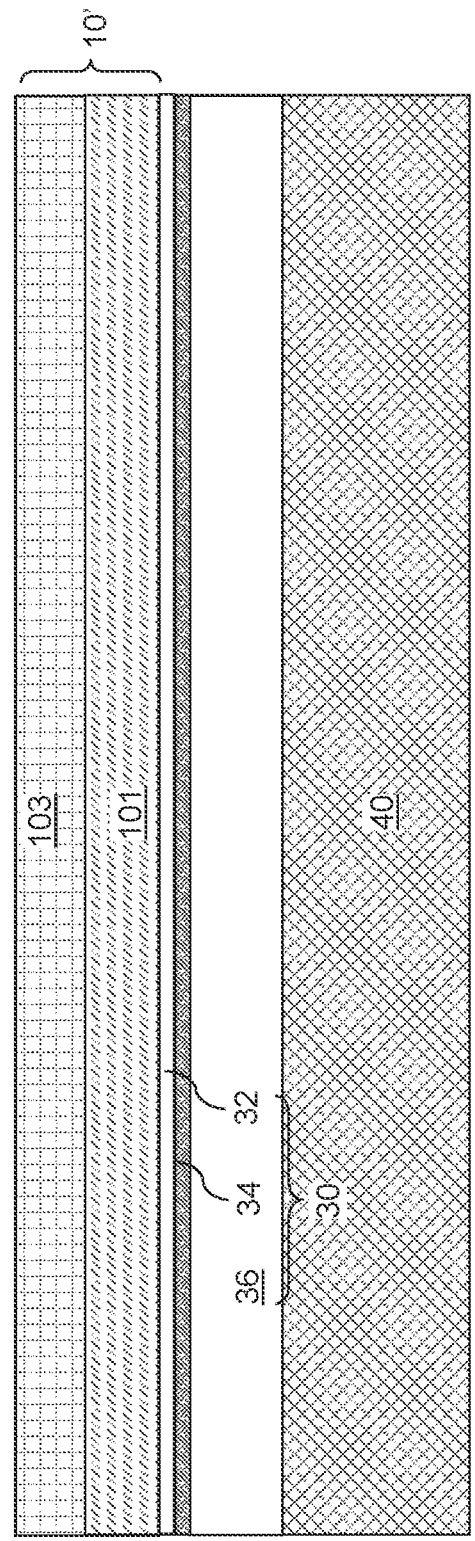

SEMICONDUCTOR-ON-INSULATOR (SOI) SEMICONDUCTOR STRUCTURES INCLUDING A HIGH-K DIELECTRIC LAYER AND METHODS OF MANUFACTURING THE SAME

BACKGROUND

A semiconductor-on-insulator (SOI) substrate includes a top semiconductor material layer that is attached to a conductive material layer via an intervening insulating material layer. The intervening insulating material layer provides electrical isolation between the semiconductor material layer and the conductive material layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a vertical cross-sectional view of an exemplary structure that includes a substrate semiconductor layer according to an embodiment of the present disclosure.

FIG. 2 is a vertical cross-sectional view of the exemplary structure after formation of a p-doped single crystalline semiconductor layer according to an embodiment of the present disclosure.

FIG. 3 is a vertical cross-sectional view of the exemplary structure after formation of a first bonding dielectric material layer according to an embodiment of the present disclosure.

FIG. 4 is a vertical cross-sectional view of the exemplary structure after deposition of a dielectric metal oxide layer according to an embodiment of the present disclosure.

FIG. 7 is a vertical cross-sectional view of the exemplary structure after thinning the backside of a single crystalline semiconductor material layer within the substrate semiconductor layer according to an embodiment of the present disclosure.

FIG. 8 is a vertical cross-sectional view of the exemplary structure after flipping the exemplary structure upside down according to an embodiment of the present disclosure.

DETAILED DESCRIPTION

Figure 5:
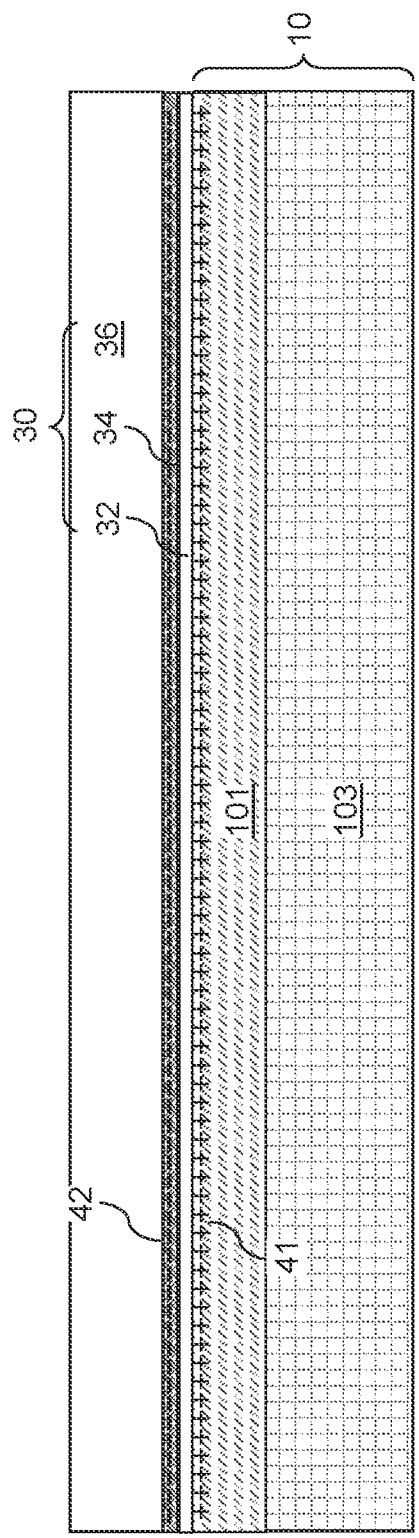
FIG. 5 is a vertical cross-sectional view of the exemplary structure after formation of a second bonding dielectric material layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, an exemplary intermediate structure in accordance with an embodiment of the present disclosure is illustrated, which includes a substrate including a substrate semiconductor layer 10. The substrate semiconductor layer 10 comprises, and/or consists essentially of, a semiconductor material. In one embodiment, the semiconductor material of the substrate semiconductor layer 10 may include, and/or may consist essentially of, at least one Group XIV element such as silicon, germanium, and/or carbon, and/or p-doped or n-doped semiconductor material based on the at least one Group XIV element. In one embodiment, the semiconductor material of the substrate semiconductor layer 10 may include, and/or may consist essentially of, intrinsic silicon, p-doped silicon, n-doped silicon, an intrinsic silicon-germanium alloy, a p-doped silicon-germanium alloy, or an n-doped silicon-germanium alloy. In embodiments in which the semiconductor material of the substrate semiconductor layer 10 may include electrical dopants (such as p-type dopants or n-type dopants), the atomic concentration of the electrical dopants in the semiconductor material of the substrate semiconductor layer 10 may be in a range from $1.0 \times 10^{13}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be used.

Alternatively, the semiconductor material of the substrate semiconductor layer 10 comprises, and/or consists essentially of, a compound semiconductor material or an organic semiconductor material. For example, the semiconductor material of the substrate semiconductor layer 10 comprises, and/or consists essentially of, a III-V compound semiconductor material, a II-VI compound semiconductor material, or an organic semiconductor material.

The thickness of the substrate semiconductor layer 10 may be selected to provide sufficient mechanical support such that the substrate may be handled in standard semiconductor processing equipment. For example, thickness of the substrate semiconductor layer 10 may be in a range from 100 microns to 2 mm, such as from 300 microns to 1 mm, although lesser and greater thicknesses may also be used.

According to an aspect of the present disclosure, the entirety of the substrate semiconductor layer 10 may be single crystalline. In one embodiment, the substrate semiconductor layer 10 may include, and/or may consist of, single crystalline silicon. The entirety of the substrate semiconductor layer 10 may be single crystalline and may have the same set of crystallographic orientations throughout.

Referring to FIG. 2, an optional ion implantation process may be performed on the intermediate structure of FIG. 1 to provide a suitable level of electrical doping in the surface portion of the substrate semiconductor layer 10. The surface portion of the substrate semiconductor layer 10 that underlies the top surface of the substrate semiconductor layer 10 may be converted into a doped substrate semiconductor layer. In one embodiment, the surface portion of the substrate semiconductor layer 10 that underlies the top surface of the substrate semiconductor layer 10 may be doped with p-type dopants, and may be converted into a p-doped single crystalline semiconductor layer 101. In this embodiment, the atomic concentration of p-type dopants in the p-doped single crystalline semiconductor layer 101 may be in a range from $1.0 \times 10^{13}/cm^3$ to $3.0 \times 10^{18}/cm^3$, such as from $1.0 \times 10^{14}/cm^3$ to $3.0 \times 10^{17}/cm^3$ and/or from $3.0 \times 10^{14}/cm^3$ to $1.0 \times 10^{17}/cm^3$, although lesser and greater atomic concentrations may also be used. The thickness of the p-doped single crystalline semiconductor layer 101 may be in a range from 100 nm to 2 microns, although lesser and greater thicknesses may also be used. The unimplanted portion of the substrate semiconductor layer 10 is herein referred to as a base single crystalline semiconductor material layer 103 or as an unimplanted substrate semiconductor layer.

While the present disclosure is described using an embodiment in which a p-doped single crystalline semiconductor layer 101 is formed in an upper portion of the substrate semiconductor layer 10, embodiments are expressly contemplated herein in which two or more p-doped single crystalline semiconductor layers 101 are formed in the upper portion of the substrate semiconductor layer 10, and/or one or more n-doped substrate semiconductor layers are formed in the upper portion of the substrate semiconductor layer 10. Further, embodiments are expressly contemplated herein in which the processing steps of FIG. 2 are omitted.

Referring to FIG. 3, a first bonding dielectric material layer 32 may be formed on the top surface of the substrate semiconductor layer 10. The first bonding dielectric material layer 32 may include a first dielectric material. The first dielectric material may provide bonding between the substrate semiconductor layer 10 and a dielectric metal oxide layer to be subsequently formed. In one embodiment, the first bonding dielectric material layer 32 may comprise, and/or may consist essentially of, a silicon oxide-containing material including silicon at an atomic percentage greater than 30% and oxygen atoms at an atomic percentage greater than 40%. In one embodiment, the first dielectric material of the first bonding dielectric material layer 32 may be selected from thermal silicon oxide, undoped silicate glass, a doped silicate glass, and silicon oxynitride.

In one embodiment, the first dielectric material of the first bonding dielectric material layer 32 may comprise, and/or consist essentially of, thermal semiconductor oxide such as thermal silicon oxide that is formed by thermal oxidation of a surface portion of the substrate semiconductor layer 10 (such as a surface portion of the p-doped single crystalline semiconductor layer 101). As used herein, a thermal semiconductor oxide refers to an oxide of a semiconductor material that is formed by a thermal oxidation process, which may be substantially free of carbon atoms. For example, thermal silicon oxide may contain carbon atoms at an atomic concentration that is less than $1.0 \times 10^{14}/cm^3$.

In one embodiment, the first dielectric material of the first bonding dielectric material layer 32 may comprise, and/or consist essentially of, undoped silicate glass or a doped silicate glass. Undoped silicate glass or doped silicate glasses (such as borosilicate glass, phosphosilicate glass, borophosphosilicate glass, and fluorosilicate glass). Undoped silicate glass or a doped silicate glass may be deposited using a chemical vapor deposition (CVD) process using tetraethylorthosilicate (TEOS) as a precursor gas and optionally using at least one dopant gas for providing dopants. In this embodiment, the deposited silicate glass material of the first bonding dielectric material layer 32 includes carbon atoms at an atomic percentage in a range from 0.01% to 5%, such as from 0.1% to 1.0%.

In one embodiment, the first dielectric material of the first bonding dielectric material layer 32 may comprise, and/or consist essentially of, silicon oxynitride. In this embodiment, a thermal silicon oxide layer, an undoped silicate glass layer, or a doped silicate glass layer may be formed on the top surface of the substrate semiconductor layer 10, and a nitridation process, such as a thermal nitridation process, may be performed to convert the thermal silicon oxide layer, the undoped silicate glass layer, or the doped silicate glass layer into a silicon oxynitride layer including nitrogen atoms at an atomic percentage in a range from 1% to 30%, such as from 3% to 10%. The silicon oxynitride material of the first bonding dielectric material layer 32 may be substantially free of carbon, or may comprise carbon atoms at an atomic percentage in a range from 0.01% to 5%, such as from 0.1% to 1.0%.

According to an aspect of the present disclosure, the first bonding dielectric material layer 32 may be thick enough such that the first bonding dielectric material layer 32 may be formed as a continuous material layer without any opening therethrough while providing sufficient bonding strength. Further, the first bonding dielectric material layer 32 may be thin enough such that electrical charges located on opposite surfaces of the first bonding dielectric material layer 32 may be capacitively coupled and remain in place during operation of semiconductor devices to be subsequently formed. In one embodiment, the first bonding dielectric material layer 32 may have a first thickness in a range from 1 nm to 10 nm, such as from 2 nm to 5 nm, although lesser and greater thicknesses may also be used.

Referring to FIG. 4 and according to an aspect of the present disclosure, a dielectric metal oxide layer 34 may be deposited directly on the first bonding dielectric material layer 32. In one embodiment, the dielectric metal oxide layer 34 may include a dielectric metal oxide material that may trap negative electrical charges therein. In one embodiment, the dielectric metal oxide layer 34 comprises, and/or consists essentially of, a dielectric metal oxide material having a dielectric constant greater than 7.9 and including an oxide of at least one metal selected from rare earth elements, transition metals, and aluminum. For example, the dielectric metal oxide layer 34 comprises, and/or consists essentially of, lanthanum oxide, yttrium oxide, zirconium oxide, titanium oxide, tantalum oxide, hafnium oxide, aluminum oxide, or alloys of layer stacks thereof. In one embodiment, the dielectric metal oxide layer 34 may trap negative charges therein, and may induce formation of formation of a positive surface charge layer (not expressly illustrated) within the surface region of the substrate semiconductor layer 10 that is in contact with the first bonding dielectric material layer 32.

The dielectric metal oxide layer 34 comprises, and/or consists essentially of, a single dielectric metal oxide material or a layer stack including multiple dielectric metal oxide materials. In some embodiments, the dielectric metal oxide layer 34 comprises a ferroelectric metal oxide material having a net dipole moment pointing downward. In this embodiment, the exemplary structure may be subjected to a downward pointing vertical electrical field to induce downward-pointing alignment of the dipole moments of the ferroelectric metal oxide material of the dielectric metal oxide layer 34. The downward-pointing alignment of the dipole moments may induce formation of a positive surface charge layer within the surface region of the substrate semiconductor layer 10 that is in contact with the first bonding dielectric material layer 32.

Generally, material composition and the thickness of the dielectric metal oxide layer 34 may be selected such that a positive surface charge layer may be induced within the surface region of the substrate semiconductor layer 10 that is in contact with the first bonding dielectric material layer 32. The dielectric metal oxide layer 34 may be formed by chemical vapor deposition (CVD) process or an atomic layer deposition (ALD) process.

The dielectric metal oxide layer 34 may be thick enough to be formed as a continuous dielectric material layer without any opening therethrough, and may be thin enough to provide sufficient electrostatic attraction between a positive surface charge layer that is induced in the substrate semiconductor layer 10 and negative charges trapped in the dielectric metal oxide layer 34 or the proximal negative charges of the aligned dipole moments therein. The dielectric metal oxide layer 34 may have a thickness in a range from 1 nm to 10 nm, such as from 2 nm to 5 nm, although lesser and greater thicknesses may also be used.

Referring to FIG. 5, a second bonding dielectric material layer 36 may be formed by deposition of a second dielectric material over the dielectric metal oxide layer 34. The second dielectric material may be selected such that the second dielectric material provides sufficient bonding strength between the dielectric metal oxide layer 34 and a conductive material to be subsequently deposited.

In one embodiment, the second bonding dielectric material layer 36 comprises, and/or consists essentially of, a second dielectric material selected from undoped silicate glass, a doped silicate glass, silicon oxynitride, silicon carbide, silicon carbide nitride, and silicon nitride. The thickness of the second bonding dielectric material layer 36 may be selected such that capacitive coupling between electrical charges in the dielectric metal oxide layer 34 with a surface charge layer in the substrate semiconductor layer 10 is greater than electrical coupling between the electrical charges in the dielectric metal oxide layer 34 with the conductive material to be subsequently deposited over the second bonding dielectric material layer 36. In one embodiment, the second bonding dielectric material layer 36 may have a second thickness in a range from 50 nm to 1,000 nm, such as from 100 nm to 500 nm, although lesser and greater thicknesses may also be used. The second bonding dielectric material layer 36 may be deposited by a chemical vapor deposition process. In one embodiment, the upper limit of the thickness of the second bonding dielectric material layer 36 may be imposed by the processing cost and the process time of the deposition process used to deposit the second bonding dielectric material layer 36.

In embodiments in which the second bonding dielectric material layer 36 includes a dielectric material such as undoped silicate glass, a doped silicate glass, or silicon oxynitride, tetraethylorthosilicate (TEOS) may be used as a precursor gas, and the second bonding dielectric material layer 36 may comprise carbon atoms at an atomic percentage in a range from 0.01% to 5%, such as from 0.1% to 1.0%. In embodiments in which silicon carbide nitride or silicon carbide is used for the second bonding dielectric material layer 36, the second bonding dielectric material layer 36 may comprise carbon at an atomic concentration in a range from 20% to 60%. In embodiments in which silicon nitride is used for the second bonding dielectric material layer 36, the second bonding dielectric material layer 36 may be formed by a low pressure chemical vapor deposition process using ammonia and a silicon-containing precursor gas such as silane or dichlorosilane. In this embodiment, the silicon nitride material of the second bonding dielectric material layer 36 may be substantially free of carbon, i.e., may include carbon at an atomic concentration less than 1 part per million, and/or less than 0.1 part per million, and/or less than 0.01 part per million.

A layer stack is formed, over a top surface of a substrate including the substrate semiconductor layer 10. The layer stack includes, from bottom to top, the first bonding dielectric material layer 32, the dielectric metal oxide layer 34, and the second bonding dielectric material layer 36. The layer stack is herein referred to as a composite buried insulating layer 30, which becomes a buried layer upon formation of a conductive material layer in a subsequent processing step.

Upon formation of the second bonding dielectric material layer 36, a negative charge layer 42 may be formed within the dielectric metal oxide layer 34. In one embodiment, the dielectric metal oxide material of the dielectric metal oxide layer 34 may trap negative charges therein due to the various surface states that are inherently present in the dielectric metal oxide layer 34. The negative charges within the dielectric metal oxide layer 34 may attract positive charges in a surface portion of the substrate semiconductor layer 10 that is proximal to the first bonding dielectric material layer 32. Thus, the substrate semiconductor layer 10 comprises a positive surface charge layer 41 at a surface region of the substrate semiconductor layer 10 that is in proximity to an interface with the first bonding dielectric material layer 32. Alternatively, a ferroelectric dielectric material may be used for the dielectric metal oxide layer 34 and downward-pointing dipole moments may be induced in the dielectric metal oxide layer 34 to induce the positive surface charge layer 41 at the surface region of the substrate semiconductor layer 10 that is in proximity to an interface with the first bonding dielectric material layer 32.

Figure 6:
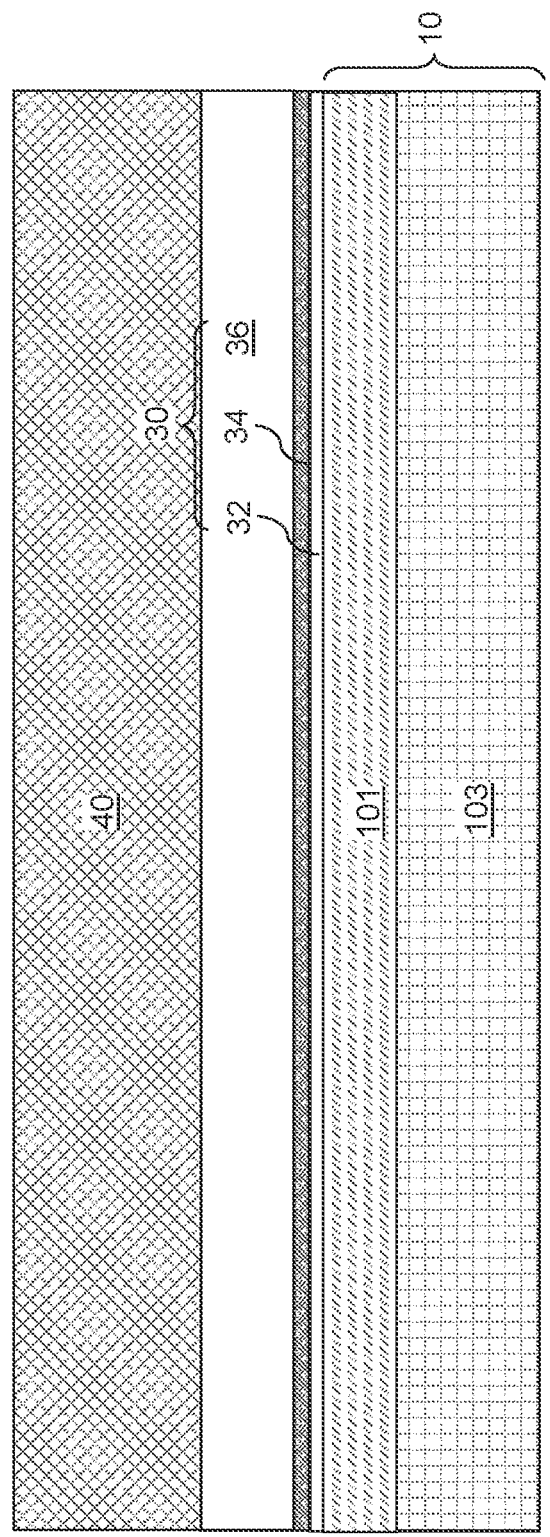
FIG. 6 is a vertical cross-sectional view of the exemplary structure after deposition of a conductive material according to an embodiment of the present disclosure.

Referring to FIG. 6, a conductive material layer 40 may be formed by depositing a conductive material over the top surface (i.e., a distal surface that is distal from an interface with the dielectric metal oxide layer 34) of the second bonding dielectric material layer 36. The conductive material of the conductive material layer 40 may be selected from a metallic material or a doped semiconductor material. For example, the conductive material layer 40 may comprise, and/or consist essentially of, an elemental metal, an intermetallic alloy, a conductive metallic nitride, a conductive metallic carbide, a heavily doped semiconductor material, an alloy thereof, or a layer stack thereof. In an illustrative example, the conductive material layer 40 may comprise, and/or consist essentially of, a transition metal, a Lanthanide metal, aluminum, TiN, TaN, WN, TiC, TaC, WC, a metal silicide, a metal germanide, a metal germanosilicide, a heavily doped elemental semiconductor material (such as heavily doped silicon), a heavily doped compound semiconductor material (such as heavily doped GaN), an alloy thereof, or a layer stack thereof. In embodiments in which the conductive material layer 40 includes a doped semiconductor material including electrical dopants (such as p-type dopants or n-type dopants), the atomic concentration of electrical dopants in the doped semiconductor material may be in a range from $1.0 \times 10^{20}/cm^3$ to $5.0 \times 10^{21}/cm^3$, although lesser and greater atomic concentrations may also be used.

Generally, the conductive material of the conductive material layer 40 may be deposited by a conformal or non-conformal deposition process. For example, the conductive material may be deposited by chemical vapor deposition, atomic layer deposition, physical vapor deposition, or any other suitable deposition process. The thickness of the conductive material layer 40 may be selected such that the conductive material layer 40 may provide sufficiently low sheet resistance and enables free movement of charge carriers (such as electrons or holes) during operation of semiconductor devices to be subsequently formed. In one embodiment, the conductive material layer 40 may have a thickness in a range from 10 nm to 1,000 nm, such as from 30 nm to 600 nm, although lesser and greater thicknesses may also be used. The conductive material of the conductive material layer 40 may be deposited on an amorphous surface of the second bonding dielectric material layer 36. As such, the conductive material of the conductive material layer 40 may be amorphous or polycrystalline. A suitable anneal process may be optionally performed to increase the conductivity of the conductive material layer 40.

According to an aspect of the present disclosure, the dielectric metal oxide layer 34 may be more proximal to an interface between the first bonding dielectric material layer 32 and the substrate semiconductor layer 10 than to an interface between the second bonding dielectric material layer 36 and the conductive material layer 40. The greater thickness of the second bonding dielectric material layer 36 relative to the thickness of the first bonding dielectric material layer 32 ensured that electrical coupling between electrical charges in the dielectric metal oxide layer 34 and the substrate semiconductor layer 10 may be greater than electrical coupling between the electrical charges in the dielectric metal oxide layer 34 and the conductive material layer 40.

Optionally, a disposable handle substrate (not illustrated) may be attached to the top surface of the conductive material layer 40. For example, the disposable handle substrate may comprise a semiconductor substrate, a dielectric substrate, or a conductive substrate, and may have a thickness in a range from 300 microns to 1 mm. The disposable handle substrate may be attached to the top surface of the conductive material layer using an adhesive layer (not illustrated).

Referring to FIG. 7, the substrate semiconductor layer 10 may be thinned from the backside. Specifically, the substrate semiconductor layer 10 may be thinned by removing portions of the substrate semiconductor layer 10 that are distal from the composite buried insulating layer 30. In one embodiment, the backside of the base single crystalline semiconductor material layer 103 within the substrate semiconductor layer 10 may be removed by performing at least one substrate thinning process. The at least one substrate thinning process may comprise grinding, polishing, an anisotropic etch process, and/or an isotropic etch process.

The remaining portion of the substrate semiconductor layer 10 that remains after the thinning process comprises a top semiconductor layer 10'. In one embodiment, the top semiconductor layer 10' comprises the p-doped single crystalline semiconductor layer 101 and a remaining portion of the base single crystalline semiconductor material layer 103. In one embodiment, the top semiconductor layer 10' may have a thickness that is not less than the thickness of the conductive material layer 40. In one embodiment, the entirety of the top semiconductor layer 10' may be single crystalline, and may be thicker than the conductive material layer 40. In one embodiment, the thickness of the conductive material layer 40 may be in a range from 10 nm to 1,000 nm, and the thickness of the top semiconductor layer 10' may be in a range from 1 micron to 10 microns, such as from 2 microns to 5 microns, although lesser and greater thicknesses may also be used for each of the conductive material layer 40 and the top semiconductor layer 10'. In one embodiment, the ratio of the thickness of the top semiconductor layer 10' to the thickness of the conductive material layer 40 may be in a range from 1 to 100, such as from 3 to 30.

Referring to FIG. 8, the exemplary structure may be inverted (flipped upside down) for subsequent processing on the side of the top semiconductor layer 10'.

Figure 9:
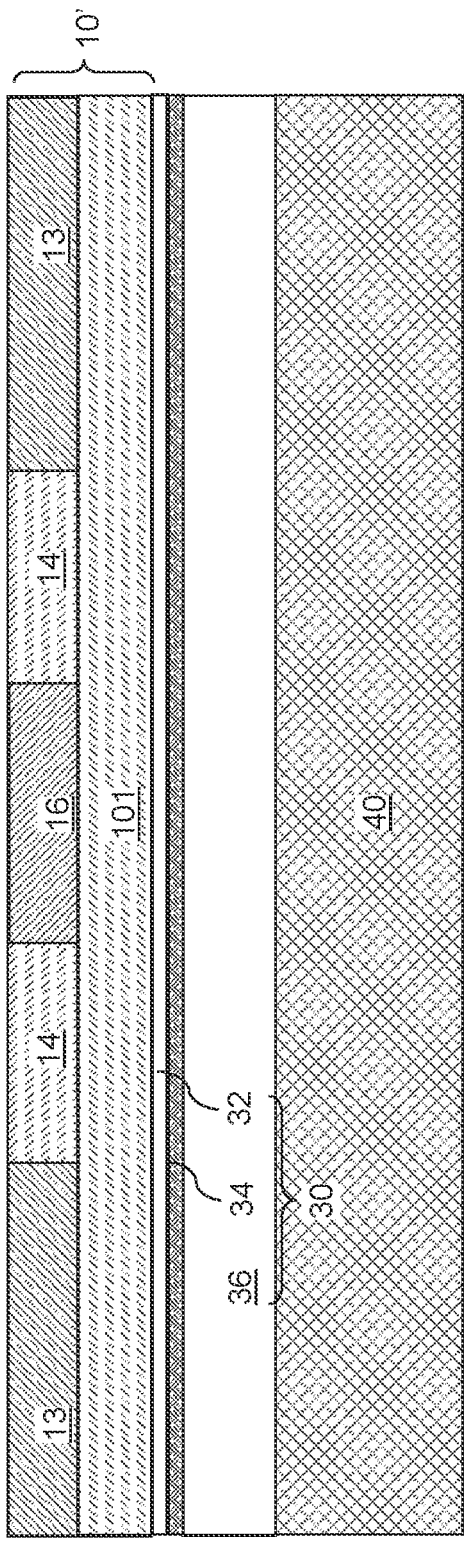
FIG. 9 is a vertical cross-sectional view of the exemplary structure after formation of p-doped wells, an n-doped well, and n-doped drift regions according to an embodiment of the present disclosure.

Referring to FIG. 9, various masked ion implantation processes may be performed to form various doped semiconductor material portions in the base single crystalline semiconductor material layer 103. The patterns, depths, and doping types of the various doped semiconductor material portions may be selected based on the types of semiconductor devices to be subsequently formed.

In an illustrative example, the semiconductor devices to be subsequently formed may comprise a power field effect transistor configured to operate at high voltages (such as voltages in a range from 5 V to 100 V). In this case, the various doped semiconductor material portions may include p-doped wells 13, an n-doped well 16, and n-doped drift regions 14. For example, the p-doped wells 13 may include p-type electrical dopants at an atomic concentration in a range from $1.0 \times 10^{15}/cm^3$ to $1.0 \times 10^{18}/cm^3$; the n-doped well 16 may include n-type electrical dopants at an atomic concentration in a range from $1.0 \times 10^{16}/cm^3$ to $1.0 \times 10^{19}/cm^3$; and the n-doped drift regions 14 may include n type electrical dopants at an atomic concentration in a range from $1.0 \times 10^{14}/cm^3$ to $1.0 \times 10^{18}/cm^3$, although lesser and greater dopant concentrations may be used for each of the doped semiconductor regions.

While the present disclosure is described using an embodiment in which a power field effect transistor is formed in the top semiconductor layer 10', any type of semiconductor devices may be formed in, or on, the top semiconductor layer 10'. For example, low voltage field effect transistors, bipolar transistors, fin field effect transistors, gate-all-around (GAA) field effect transistors, diodes, resistors, capacitors, or other types of semiconductor devices may be formed in, or on, the top semiconductor layer 10'.

Figure 10:
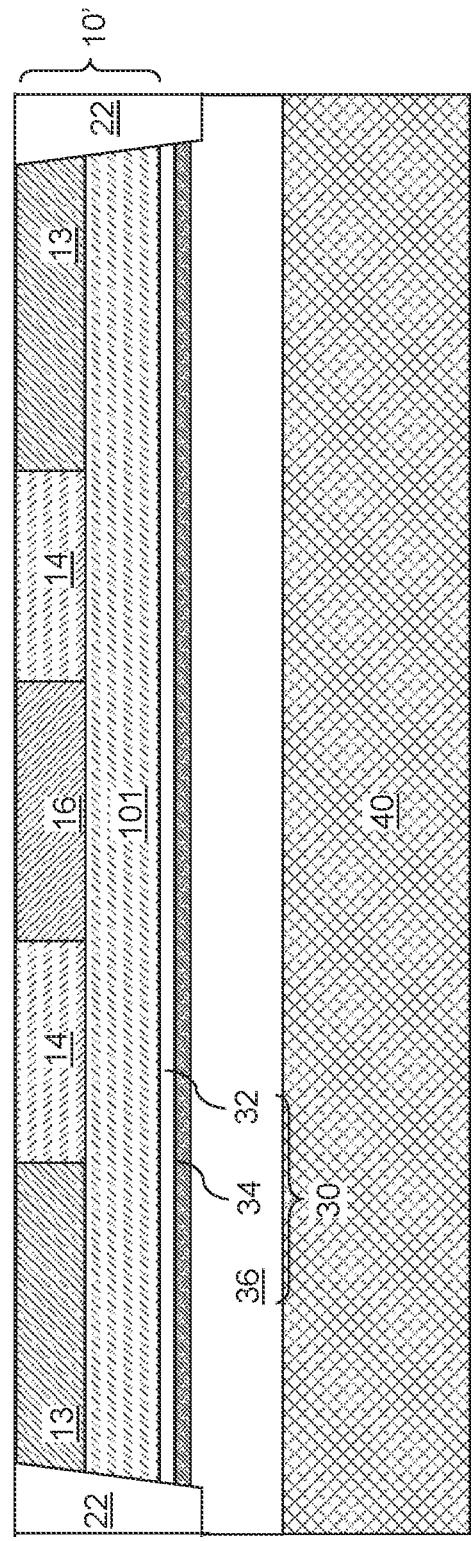
FIG. 10 is a vertical cross-sectional view of the exemplary structure after formation of deep trench isolation structures according to an embodiment of the present disclosure.

Referring to FIG. 10, deep trenches vertically extending through the top semiconductor layer 10' may be formed, for example, by applying and patterning a first photoresist layer (not shown) over the top semiconductor layer 10', and by performing an anisotropic etch process that transfers the pattern in the first photoresist layer through the top semiconductor layer 10'. In one embodiment, the deep trenches may vertically extend through the entire thickness of the top semiconductor layer 10', and through the first bonding dielectric material layer 32 and/or through the dielectric metal oxide layer 34 and optionally into an upper portion of the second bonding dielectric material layer 36. For example, the depth of the deep trenches may be in a range from 1 micron to 12 microns, such as from 2 microns to 6 microns, although lesser and greater depths may also be used.

A first dielectric fill material may be deposited in the deep trenches, and excess portions of the first dielectric fill material may be removed from above the horizontal plane including the top surface of the top semiconductor layer 10' by a planarization process. The planarization process may use a recess etch process and/or a chemical mechanical polishing (CMP) process. The remaining portions of the first dielectric fill material constitutes a deep trench isolation structure 22. In one embodiment, the deep trench isolation structure 22 contacts sidewalls of the top semiconductor layer 10', and may contact the dielectric metal oxide layer 34.

Figure 11:
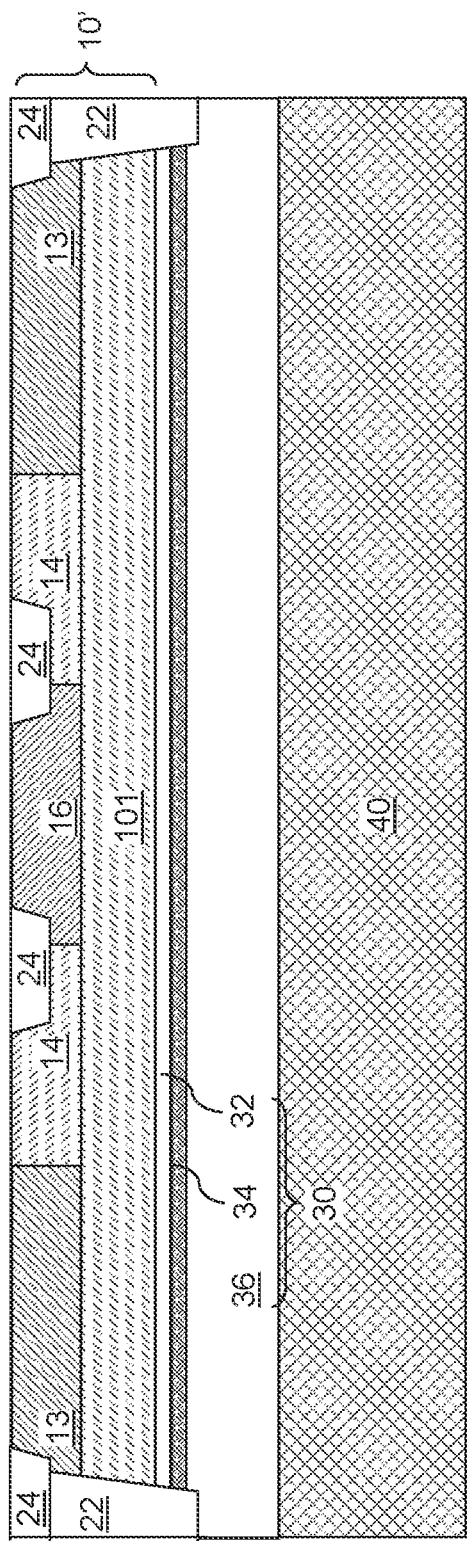
FIG. 11 is a vertical cross-sectional view of the exemplary structure after formation of shallow trench isolation structures according to an embodiment of the present disclosure.

Referring to FIG. 11, shallow trenches vertically extending through an upper portion of the top semiconductor layer 10' may be formed, for example, by applying and patterning a second photoresist layer (not shown) over the top semiconductor layer 10', and by performing an anisotropic etch process that transfers the pattern in the second photoresist layer into the upper portion of the top semiconductor layer 10'. The depth of the shallow trenches may be less than the depths of the p-type wells 13, the n-type well 16, and/or the n-type drift regions 14. For example, the depth of the shallow trenches may be in a range from 50 nm to 500 nm, such as from 100 nm to 300 nm, although lesser and greater depths may also be used.

A second dielectric fill material may be deposited in the shallow trenches, and excess portions of the second dielectric fill material may be removed from above the horizontal plane including the top surface of the top semiconductor layer 10' by a planarization process. The planarization process may use a recess etch process and/or a chemical mechanical polishing (CMP) process. The remaining portions of the first dielectric fill material constitutes a shallow trench isolation structure 24. In one embodiment, the shallow trench isolation structure 24 may be vertically spaced from the composite buried insulating layer 30.

In one embodiment, the shallow trench isolation structure 24 may contact the deep trench isolation structure 22, and may divide the top surface of the top semiconductor layer 10' into various top semiconductor surfaces that are disconnected among one another. For example, portions of the shallow trench isolation structure 24 may be formed at upper portions of the interfaces between the n-doped well 16 and the n-doped drift regions 14. In one embodiment, the combination of the deep trench isolation structure 22 and the shallow trench isolation structure 24 vertically extends from a horizontal plane including a top surface of the top semiconductor layer 10' to the composite buried insulating layer 30, and may extend to the dielectric metal oxide layer 34.

Figure 12:
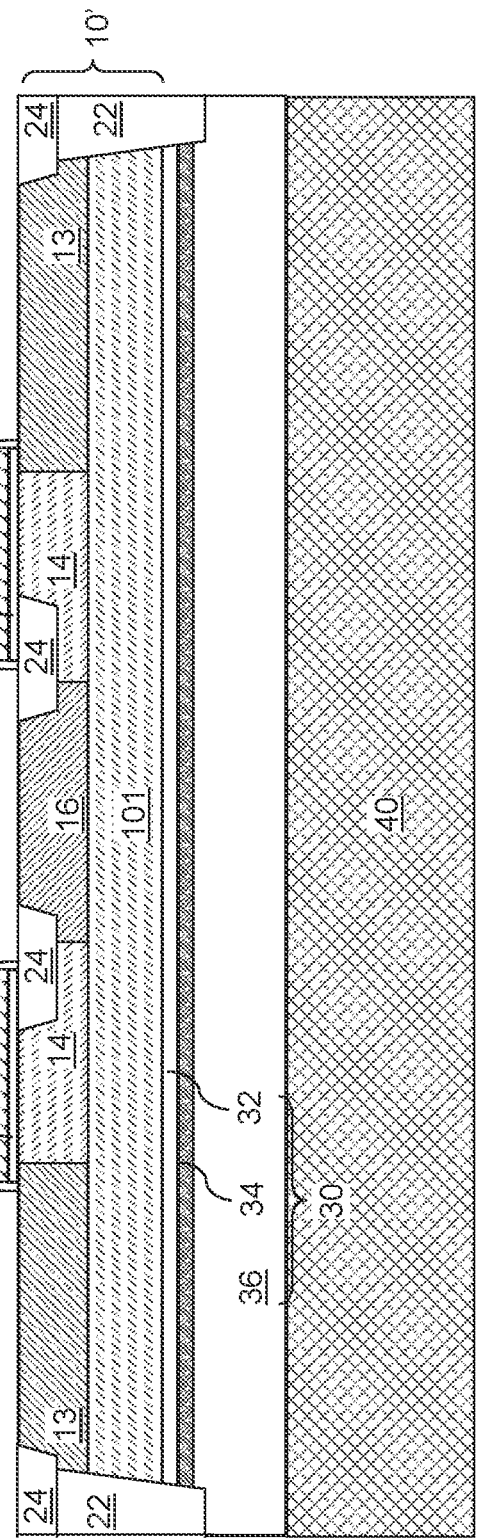
FIG. 12 is a vertical cross-sectional view of the exemplary structure after formation of gate stack structures according to an embodiment of the present disclosure.

Referring to FIG. 12, a gate dielectric layer and a gate electrode material layer may be deposited over the top semiconductor layer 10'. A photoresist layer (not shown) may be applied over the gate electrode material layer, and may be lithographically patterned into the patten of gate electrodes to be subsequently formed. An anisotropic etch process may be performed to transfer the pattern in the photoresist layer through the gate electrode material layer and into the gate dielectric layer. Patterned portions of the gate electrode material layer comprise gate electrodes 52, and patterned portions of the gate dielectric layer comprise gate dielectrics 50. Each contiguous combination of a gate dielectric 50 and a gate electrode 52 constitutes a gate stack (50, 52). Various source/drain extension regions (not shown) may be optionally formed. Optionally, gate spacers 56 may be formed by conformally depositing a dielectric gate spacer material layer and by anisotropically etching horizontally-extending portions of the dielectric gate spacer material layer.

In one embodiment, the semiconductor device to be formed on the top semiconductor layer 10' comprises a power field effect transistor, and a gate dielectric 50 overlies a top portion of a p-doped well 13, an n-doped drift region 14, and a portion of a shallow trench isolation structure 24 straddling the n-doped drift region 14 and the n-doped well 16. A gate electrode 52 overlies the gate dielectric 50.

Figure 13:
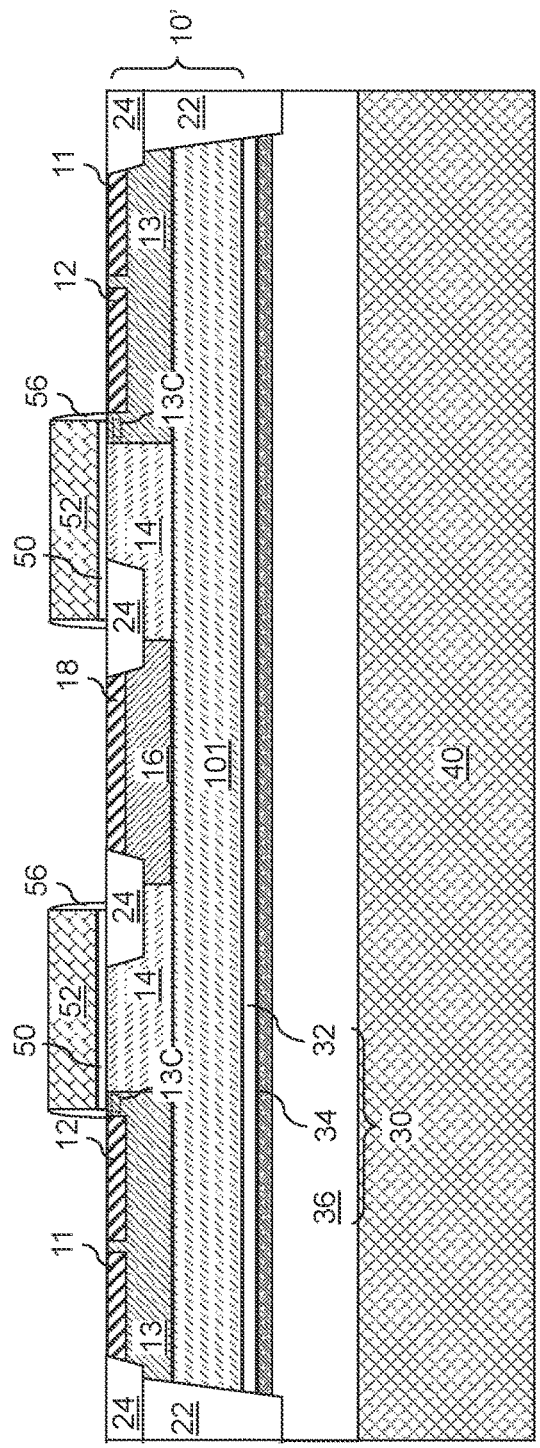
FIG. 13 is a vertical cross-sectional view of the exemplary structure after formation of source regions, drain regions, and body contact regions according to an embodiment of the present disclosure.

Referring to FIG. 13, various source/drain regions (12, 18) and body contact regions 11 may be formed by performing masked ion implantation processes. For example, a first masked ion implantation process may be performed to form heavily n-doped regions. In an illustrative example, the heavily n-doped regions may comprise n-doped source regions 12 that are formed in an upper portion of a respective p-doped well 13 adjacent to a gate stack (50, 52) (and a gate spacer 56, if present), and an n-doped drain region 18 that is formed in an upper portion of the n-doped well 16. A second masked ion implantation process may be performed to form heavily p-doped regions. In an illustrative example, the heavily p-doped regions may comprise body contact regions 11 that are formed in an upper portion of the p-doped wells 13 and adjacent to the n-doped source regions 12. Surface portions of the p-doped wells 13 that underlie a gate dielectric 50 or a gate spacer 56 comprise semiconductor channels 13C.

Generally, various types of semiconductor devices may be formed in, and/or on, the top semiconductor layer 10'. In one embodiment, the semiconductor devices may comprise field effect transistors. Each field effect transistor may comprise a source region, a drain region, a semiconductor channel, and a gate electrode. In one embodiment, one of the semiconductor devices includes a power field effect transistor. In this embodiment, a gate dielectric 50 overlies a top portion of a p-doped well 13 that is adjacent to an n-doped source region 12, and overlies an n-doped drift region 14 that is located between the p-doped well 13 and an n-doped well 16, and overlies a portion of a shallow trench isolation structure 24 that overlies a recessed portion of the n-doped drift region 14 that includes an interface with the n-doped well 16.

Figure 14:
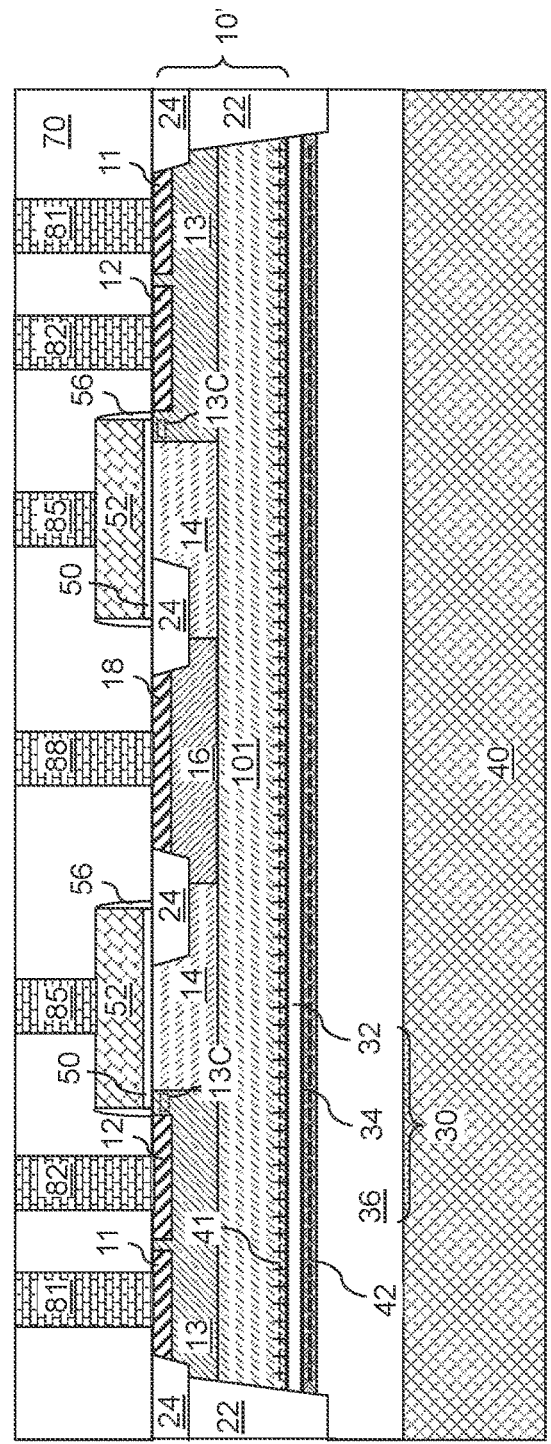
FIG. 14 is a vertical cross-sectional view of the exemplary structure after formation of a contact-level dielectric layer and various contact via structures.

Referring to FIG. 14, a contact-level dielectric layer 70 may be formed over the various semiconductor devices by deposition of a dielectric material such as undoped silicate glass or a doped silicate glass. Various contact via cavities may be formed through the contact-level dielectric layer 70 by a combination of lithographic patterning step and an anisotropic etch process. At least one conductive fill material may be deposited in the contact via cavities, and excess portions of the at least one conductive fill material may be removed from above the horizontal plane including the top surface of the contact-level dielectric layer 70 by a planarization process. The planarization process may comprise a recess etch process and/or a chemical mechanical polishing (CMP) process. The various contact via structures may comprise source contact via structures 82 contacting source regions (such as n-doped source regions 12), drain contact via structures 88 contacting drain regions (such as the n-doped drain region 18), gate contact via structures 85 contacting the gate electrodes 52, and body contact via structures 81 contacting the body contact regions 11. Generally, metal interconnect structures (such as the contact via structures) electrically connected to a respective one of the source regions, the drain regions, the gate electrodes, and the body contact regions may be formed.

Referring collectively to FIGS. 1-14 and according to various embodiments of the present disclosure, a semiconductor structure is provided, which may include: a conductive material layer 40; a composite buried insulating layer 30 overlying the conductive material layer 40 and including, from top to bottom, a first bonding dielectric material layer 32, a dielectric metal oxide layer 34, and a second bonding dielectric material layer 36; a top semiconductor layer 10' overlying the composite buried insulating layer 30; and at least one semiconductor device located on the top semiconductor layer 10'.

In one embodiment, the top semiconductor layer 10' may include a positive surface charge layer 41 within a surface region located in proximity to an interface with the first bonding dielectric material layer 32. In one embodiment, the dielectric metal oxide layer 34 may include negative charges that are trapped therein. Optionally, the dielectric metal oxide layer 34 comprises a ferroelectric metal oxide material having a net dipole moment pointing downward and induces formation of the positive surface charge layer 41 within the surface region of the top semiconductor layer 10'. In one embodiment, the dielectric metal oxide layer 34 may be more proximal to an interface between the first bonding dielectric material layer 32 and the top semiconductor layer 10' than to an interface between the second bonding dielectric material layer 36 and the conductive material layer 40, which may comprise, and/or consist essentially of, a metallic material or a heavily doped semiconductor material having electrical conductivity greater than $10^3$ S/cm.

According to another aspect of the present disclosure, a semiconductor structure is provided, which may include: a conductive material layer 40; a composite buried insulating layer 30 overlying the conductive material layer 40 and including, from top to bottom, a first bonding dielectric material layer 32, a dielectric metal oxide layer 34, and a second bonding dielectric material layer 36; a top semiconductor layer 10' overlying the composite buried insulating layer 30 and containing a p-doped single crystalline semiconductor layer 101 in contact with the first bonding dielectric material layer 32, wherein the p-doped single crystalline semiconductor layer 101 comprises a positive surface charge layer 41 at a surface region in proximity to an interface with the first bonding dielectric material layer 32, a p-doped well 13 contacting a first portion of a top surface of the p-doped single crystalline semiconductor layer 101, and an n-doped well 16 contacting a second portion of the top surface of the p-doped single crystalline semiconductor layer 101; and a semiconductor device located on the top semiconductor layer 10'.

Figure 15:
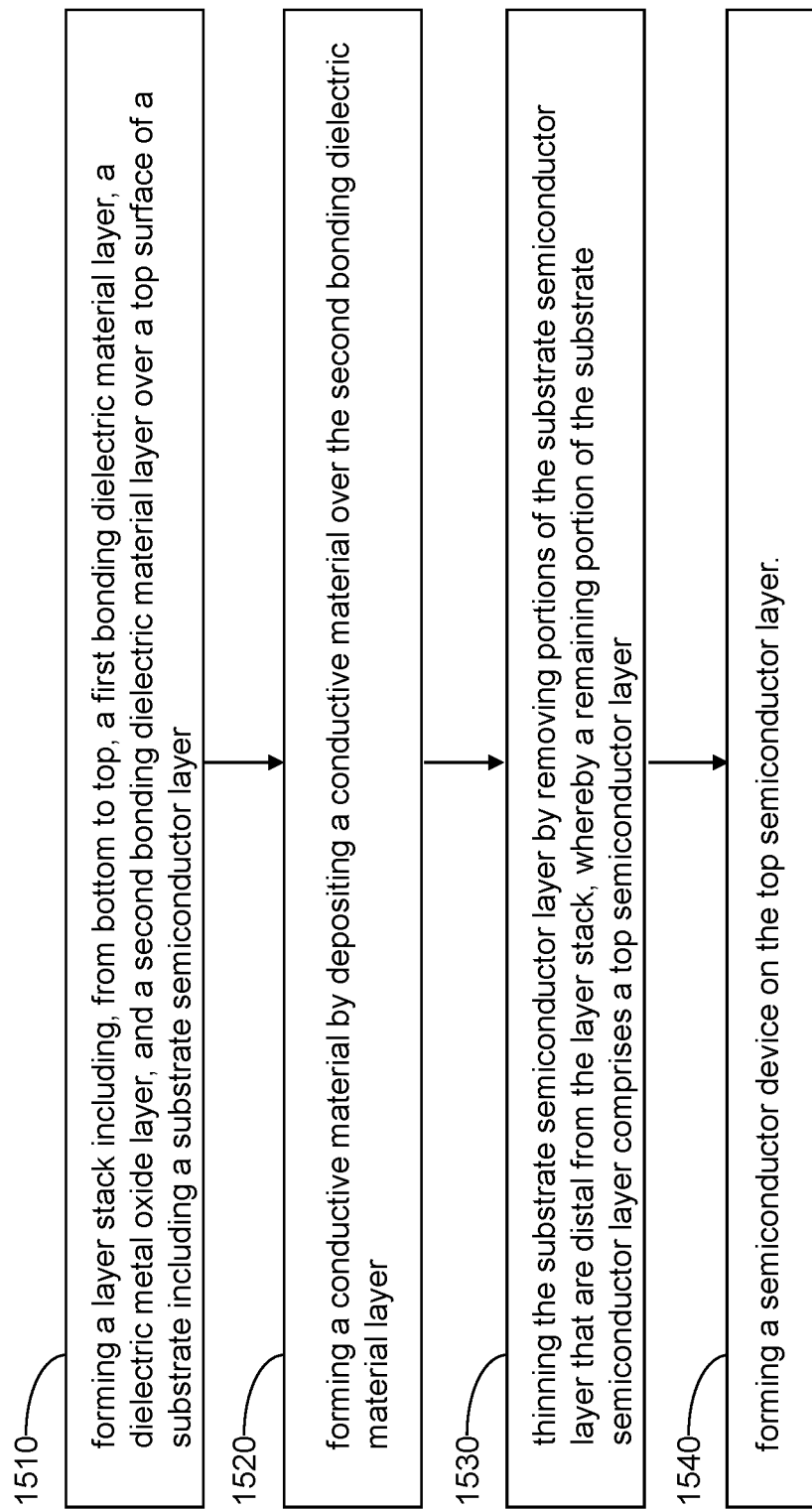
FIG. 15 is a flowchart illustrating steps for forming a semiconductor structure according to an embodiment of the present disclosure.

Referring to FIG. 15, a flowchart illustrates a sequence of processing steps for forming a semiconductor structure according to an embodiment of the present disclosure.

Referring to step 1510 and FIGS. 1-5, a layer stack 30 is formed over a top surface of a substrate including a substrate semiconductor layer 10. The layer stack 30 includes, from bottom to top, a first bonding dielectric material layer 32, a dielectric metal oxide layer 34, and a second bonding dielectric material layer 36.

Referring to step 1520 and FIG. 6, a conductive material layer 40 may be formed by depositing a conductive material over the second bonding dielectric material layer 36.

Referring to step 1530 and FIG. 7, the substrate semiconductor layer 10 may be thinned by removing portions of the substrate semiconductor layer 10 that are distal from the layer stack 30. A remaining portion of the substrate semiconductor layer 10 comprises a top semiconductor layer 10'.

Referring to step 1540 and FIGS. 8-14, a semiconductor device may be formed on the top semiconductor layer 10'.

Generally, a high density of interfacial states is present at an interface between a semiconductor material layer (such as a top semiconductor layer) and a buried insulating layer. The high density of interfacial states induce a high level of leakage current within a surface region of the semiconductor material layer adjacent to the interface with the buried insulating layer, and degrades device performance of semiconductor devices such as power field effect transistors. The various embodiments of the present disclosure may be used to incorporate a negative-charge-rich high-k dielectric film, i.e., a dielectric metal oxide layer 34 including a negative charge layer 42) adjacent to a top semiconductor layer 10' including a single crystalline semiconductor material (such as single crystalline silicon). The negative-charge-rich high-k dielectric film is formed within a buried insulating layer (i.e., within the composite buried insulating layer 30), and passivates natural interface states during the manufacturing process. Leakage current along the interface between the top semiconductor layer 10' and the composite buried insulating layer 30 may be suppressed due to the presence of the pinned electrical charges in the positive surface charge layer 41. For example, the positive charges (such as holes) within the positive surface charge layer 41 within the p-doped single crystalline semiconductor layer 101 repel holes that drift downward from the p-doped wells 13, and blocks the leakage current from the p-doped well 13 to the n-doped well 16 through the p-doped single crystalline semiconductor layer 101 during operation of the power field effect transistor illustrated in FIG. 14. Leakage current in other types of semiconductor devices (such as field effect transistors) may be suppressed due to the positive charges in the positive surface charge layer 41 within the p-doped single crystalline semiconductor layer 101. Thus, semiconductor devices having a lower leakage current may be provided through the various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure comprising:
   a conductive material layer;
   a composite buried insulating layer overlying the conductive material layer and including, from top to bottom, a first bonding dielectric material layer, a dielectric metal oxide layer, and a second bonding dielectric material layer;
a top semiconductor layer overlying the composite buried insulating layer; and
at least one semiconductor device located on the top semiconductor layer.

2. The semiconductor structure of claim 1, wherein the dielectric metal oxide layer comprises a dielectric metal oxide material having a dielectric constant greater than 7.9 and including an oxide of at least one metal selected from rare earth elements, transition metals, and aluminum.

3. The semiconductor structure of claim 1, wherein the top semiconductor layer comprises a positive surface charge layer within a surface region located in proximity to an interface with the first bonding dielectric material layer.

4. The semiconductor structure of claim 3, wherein the dielectric metal oxide layer comprises negative charges that are trapped therein.

5. The semiconductor structure of claim 3, wherein the dielectric metal oxide layer comprises a ferroelectric metal oxide material having a net dipole moment pointing downward and induces formation of the positive surface charge layer within the surface region of the top semiconductor layer.

6. The semiconductor structure of claim 1, wherein the dielectric metal oxide layer is more proximal to an interface between the first bonding dielectric material layer and the top semiconductor layer than to an interface between the second bonding dielectric material layer and the conductive material layer.

7. The semiconductor structure of claim 1, wherein the dielectric metal oxide layer has a thickness in a range from 1 nm to 10 nm.

8. The semiconductor structure of claim 7, wherein:
the first bonding dielectric material layer has a first thickness in a range from 1 nm to 10 nm; and
the second bonding dielectric material layer has a second thickness in a range from 50 nm to 1,000 nm.

9. The semiconductor structure of claim 1, wherein:
the conductive material layer comprises a conductive material selected from a metallic material or a doped semiconductor material; and
the conductive material is polycrystalline or amorphous.

10. The semiconductor structure of claim 1, wherein:
the conductive material layer has a thickness in a range from 10 nm to 1,000 nm; and
the top semiconductor layer has a thickness that is not less than the thickness of the conductive material layer, and is single crystalline.

11. The semiconductor structure of claim 1, wherein:
the first bonding dielectric material layer comprises a first dielectric material selected from thermal silicon oxide, undoped silicate glass, a doped silicate glass, and silicon oxynitride; and
the second bonding dielectric material layer comprises a second dielectric material selected from undoped silicate glass, a doped silicate glass, silicon oxynitride, silicon carbide, silicon carbide nitride, and silicon nitride.

12. The semiconductor structure of claim 1, wherein the at least one semiconductor device comprises:
a field effect transistor including a source region, a drain region, a semiconductor channel, and a gate electrode; and
metal interconnect structures electrically connected to a respective one of the source region, the drain region, and the gate electrode.

13. A semiconductor structure comprising:
a conductive material layer;
a composite buried insulating layer overlying the conductive material layer and including, from top to bottom, a first bonding dielectric material layer, a dielectric metal oxide layer, and a second bonding dielectric material layer;
a top semiconductor layer overlying the composite buried insulating layer; and
at least one semiconductor device located on the top semiconductor layer, wherein the top semiconductor layer contains a p-doped single crystalline semiconductor layer in contact with the first bonding dielectric material layer.

14. The semiconductor structure of claim 13, wherein the p-doped single crystalline semiconductor layer comprises a positive surface charge layer at a surface region in proximity to an interface with the first bonding dielectric material layer.

15. The semiconductor structure of claim 14, wherein the top semiconductor layer further comprises a p-doped well contacting a first portion of a top surface of the p-doped single crystalline semiconductor layer.

16. The semiconductor structure of claim 15, wherein the top semiconductor layer comprises an n-doped well contacting a second portion of the top surface of the p-doped single crystalline semiconductor layer.

17. The semiconductor structure of claim 16, wherein the semiconductor device comprises a field effect transistor that comprises:
an n-doped source region contacting an upper portion of the p-doped well;
an n-doped drain region contacting an upper portion of the n-doped well;
a gate dielectric overlying a top portion of the p-doped well that is adjacent to the n-doped source region and overlying an n-doped drift region located between the p-doped well and an n-doped well, and a portion of a shallow trench isolation structure that overlies a recessed portion of the n-doped drift region; and
a gate electrode that overlies the gate dielectric.

18. The semiconductor structure of claim 13, further comprising:
a deep trench isolation structure contacting the dielectric metal oxide layer and contacting sidewalls of the top semiconductor layer; and
a shallow trench isolation structure located within the top semiconductor layer and contacting the deep trench isolation structure,
wherein a combination of the deep trench isolation structure and the shallow trench isolation structure vertically extends from a horizontal plane including a top surface of the top semiconductor layer to the dielectric metal oxide layer.

19. A semiconductor structure comprising:
a conductive material layer;
a composite buried insulating layer overlying the conductive material layer and including, from top to bottom, a first bonding dielectric material layer, a dielectric metal oxide layer, and a second bonding dielectric material layer;
a top semiconductor layer overlying the composite buried insulating layer;

at least one semiconductor device located on the top semiconductor layer;

a deep trench isolation structure contacting the dielectric metal oxide layer and contacting sidewalls of the top semiconductor layer; and a shallow trench isolation structure located within the top semiconductor layer and comprising a first bottom surface segment that contacts a top surface of the deep trench isolation structure.

20. The semiconductor structure of claim 19, wherein the shallow trench isolation structure comprises a second bottom surface segment that is located at a same depth as the first bottom surface segment and contacting a horizontal surface of a doped well which is a portion of the top semiconductor layer.

* * * * *